US012446177B2

(12) United States Patent
Harada (10) Patent No.: US 12,446,177 B2
(45) Date of Patent: Oct. 14, 2025

(54) ELECTRONIC DEVICE

(71) Applicant: TOSHIBA TEC KABUSHIKI KAISHA, Tokyo (JP)

(72) Inventor: Shintaro Harada, Izunokuni Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 161 days.

(21) Appl. No.: 18/482,043

(22) Filed: Oct. 6, 2023

(65) Prior Publication Data

US 2024/0268039 A1 Aug. 8, 2024

(30) Foreign Application Priority Data

Feb. 3, 2023 (JP) .................................. 2023-015245

(51) Int. Cl.
*H05K 5/10* (2025.01)
*H05K 5/02* (2006.01)
*H05K 7/20* (2006.01)

(52) U.S. Cl.
CPC ............. *H05K 5/10* (2025.01); *H05K 5/0213* (2013.01); *H05K 5/0217* (2013.01); *H05K 5/0247* (2013.01); *H05K 7/20136* (2013.01)

(58) Field of Classification Search
None
See application file for complete search history.

(56) References Cited

U.S. PATENT DOCUMENTS

| 5,067,040 A * | 11/1991 | Fallik ..................... G06F 1/20 |
| | | 361/679.48 |
| 5,860,291 A * | 1/1999 | Johnson .................. G06F 1/20 |
| | | 361/692 |
| 6,740,814 B2 * | 5/2004 | Ohta ................... H05K 5/0247 |
| | | 174/72 R |
| 8,085,536 B2 * | 12/2011 | Hsieh .................... G06F 1/181 |
| | | 361/695 |

(Continued)

FOREIGN PATENT DOCUMENTS

| JP | 07-283567 | 10/1995 |
| JP | 2001-148589 | 5/2001 |
| WO | 2021/193882 | 9/2021 |

OTHER PUBLICATIONS

Extended European Search Report for European Patent Application No. 23208501.9 dated Apr. 22, 2024.

*Primary Examiner* — Xanthia C Relford
(74) *Attorney, Agent, or Firm* — Amin, Turocy & Watson, LLP (57) ABSTRACT

An electronic device in an embodiment includes a housing including a hollow first space section with one surface of the hollow first space section opened and including a first ventilation hole, a lid provided to close the opening of the housing, including a hollow second space section, and including a second ventilation hole, a heat sink provided in the first space section and configured to radiate heat generated from an electronic component housed in the housing, and a fan provided in the first space section and configured to cool the heat sink with a flow of air caused by the fan rotating. The lid includes a ventilation port in a position facing the fan and separates the first space section and the second space section excluding the ventilation port.

19 Claims, 10 Drawing Sheets

(56) References Cited

U.S. PATENT DOCUMENTS

| | | | | |
|---|---|---|---|---|
| 8,089,761 B2* | 1/2012 | Hsieh | G06F 1/20 | 361/695 |
| 8,559,174 B2* | 10/2013 | Cheng | G06F 1/181 | 174/561 |
| 10,470,331 B1* | 11/2019 | Singh | H05K 7/20718 | |
| 10,571,206 B2* | 2/2020 | Moore | H05K 7/20809 | |
| 2003/0076652 A1* | 4/2003 | Ahn | G06F 1/184 | 361/679.02 |
| 2007/0217139 A1* | 9/2007 | Lin | G06F 1/20 | 312/223.1 |
| 2009/0016017 A1* | 1/2009 | Yu | G06F 1/20 | 361/679.33 |
| 2010/0079940 A1* | 4/2010 | Mongia | G06F 1/20 | 361/679.49 |
| 2011/0110039 A1* | 5/2011 | Feltner | H05K 7/20909 | 361/695 |
| 2013/0255987 A1* | 10/2013 | Hu | H05K 7/20172 | 248/674 |
| 2019/0045670 A1* | 2/2019 | Rabeyrin | B60L 58/26 | |
| 2019/0230825 A1* | 7/2019 | Kurozaki | H02M 7/003 | |
| 2020/0309913 A1* | 10/2020 | Oliveira | F28F 5/00 | |
| 2021/0167430 A1* | 6/2021 | Silha | H01M 50/204 | |
| 2022/0046829 A1* | 2/2022 | Ootori | H05K 7/209 | |
| 2022/0167472 A1* | 5/2022 | Feng | H05B 6/6426 | |
| 2023/0076784 A1* | 3/2023 | Tung | H05K 7/20154 | |

* cited by examiner

ELECTRONIC DEVICE

CROSS-REFERENCE TO RELATED APPLICATION

This application is based upon and claims the benefit of priority from Japanese Patent Application No. 2023-015245, filed on Feb. 3, 2023, the entire contents of which are incorporated herein by reference.

FIELD

Embodiments described herein relate generally to an electronic device, methods of cooling the electronic device, and an image processing device.

BACKGROUND

In related art, if an electronic device such as a PC (Personal Computer) performs complicated processing for, for example, generating and outputting an image, electronic components such as a CPU (Central Processing Unit), which is an example of a processor, generate a large amount of heat. Therefore, in some cases, a heat sink for heat radiation is attached to the CPU and a fan for cooling the heat sink is provided. Further, a large number of holes (ventilation holes functioning as intake holes and exhaust holes) are provided in the electronic device in order to take outdoor air into a housing and discharge air warmed by the heat generation from the housing to the outside.

However, the electronic device of the related art cannot efficiently blow the air taken in from the outside against the electronic components and efficiently cool the electronic components.

DETAILED DESCRIPTION

An aspect of embodiments is to provide an electronic device capable of efficiently cooling electronic components with air taken in from the outside.

An electronic device in an embodiment includes: a housing including a hollow first space section with one surface of the hollow first space opened and including a first ventilation hole that causes an outside and the first space section to communicate; a lid provided to close the opening of the housing, including a hollow second space section, and including a second ventilation hole that causes the outside and the second space section to communicate; a heat sink provided in the first space section and configured to radiate heat generated from an electronic component housed in the housing; and a fan provided in the first space section and configured to cool the heat sink with a flow of air caused by the fan rotating. The lid includes, in a position facing the fan, a ventilation port that causes the first space section and the second space section to communicate and is configured to separate the first space section and the second space section excluding the ventilation port.

Embodiments are explained below with reference to the drawings. For convenience of explanation, a three-dimensional coordinate system is also illustrated in the drawings. In the figures, the width direction (the left-right direction) of an electronic device 1 is represented as an X-axis direction, the depth direction (the front-rear direction) of the electronic device 1 is represented as a Y-axis direction, and the height direction (the up-down direction) of the electronic device 1 is represented as the Z-axis direction. Note that embodiments are not limited by the embodiments explained below.

First Embodiment

Figure 1:
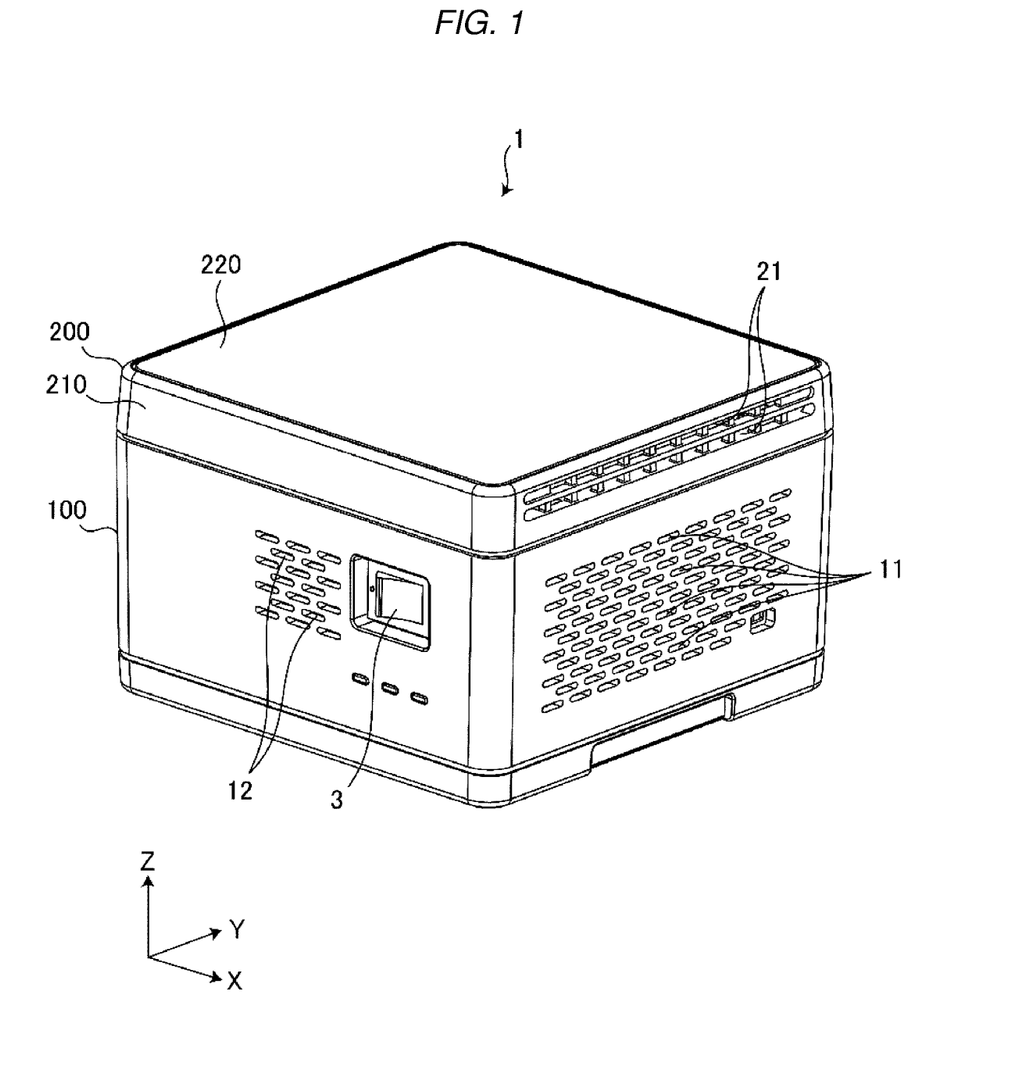
FIG. 1 is a perspective view illustrating an exterior of an electronic device in a first embodiment.
Figure 2:
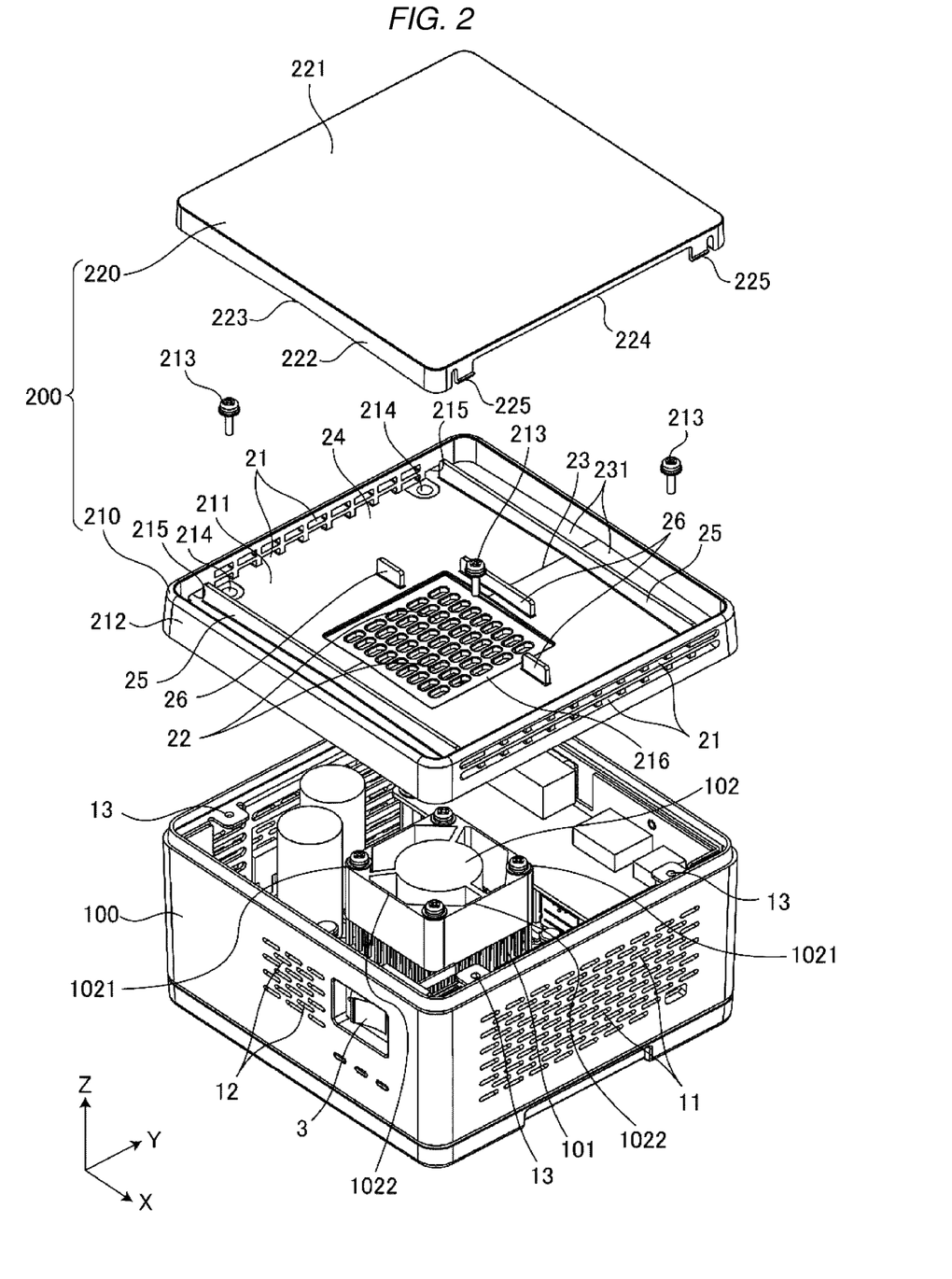
FIG. 2 is an exploded perspective view illustrating a configuration of the electronic device.

FIG. 1 is a perspective view illustrating an exterior of an electronic device 1 in a first embodiment. FIG. 2 is an exploded perspective view illustrating a configuration of the electronic device 1. As illustrated in FIGS. 1 and 2, the electronic device 1 is, for example, an image processing device such as a PC that generates an image based on information and displays the image. The electronic device 1 includes a housing 100 and a lid 200. The housing 100 is a substantially rectangular parallelepiped hollow box with the upper surface thereof opened.

A switch 3 for turning on and off the electronic device 1 is provided in the housing 100. A large number of first ventilation holes 11 and first ventilation holes 12 are formed on side surfaces of the housing 100. Specifically, the first ventilation holes 11 are formed on a certain side surface of the housing 100 and a side surface on the opposite side of the side surface. The first ventilation holes 12 are formed on side surfaces on which the first ventilation holes 11 are not formed. The first ventilation holes 11 and the first ventilation holes 12 are ventilation holes that causes an inside (a first space section 107 (see FIG. 3) explained below) of the electronic device 1 and the outside to communicate. The first ventilation holes 11 and the first ventilation holes 12 are ventilation holes for discharging air in the first space section 107 to the outside.

The lid 200 is attached to the housing 100. The lid 200 attached to the housing 100 closes an opening of the housing 100 from above. A large number of second ventilation holes 21 are formed on side surfaces (one side surface and a side surface on the opposite side of the side surface) of the lid 200. The second ventilation holes 21 are ventilation holes that cause an inside (a second space section 226 (see FIG. 3) explained below) and the outside to communicate. The second ventilation holes 21 are intake holes for sucking outside air into the second space section 226.

FIG. 2 is an exploded perspective view illustrating a configuration of the electronic device 1. As illustrated in FIG. 2, the housing 100 is a box-type container with the upper surface thereof opened. A heat sink 101 (see FIG. 3) and a fan 102 are housed on the inside of the housing 100.

The fan 102 is fixed to the heat sink 101 by four screws 1021. Substrates 106 (see FIG. 3), on the inside of which electronic components such as a CPU 105 and a storage device are implemented, are attached to the housing 100. These electronic components generate a considerable amount of heat, for example, if processing for generating an image is performed. The heat sink 101 is component that conducts the heat generated from the electronic components and radiates the heat. The fan 102 includes a plurality of blades and has a substantially quadrangular prism shape as an external shape. The fan 102 includes linear corners 1022 respectively on four sides of the fan 102 on the lid 200 side (a flowing direction upstream side of wind generated by rotation of the fan 102).

The plurality of blades rotate, whereby the fan 102 generates a flow of air and feeds the generated air to (blows the generated air against) the heat sink 101 to cool the heat sink 101.

The lid 200 is a lid having substantially the same shape as the shape of the opening of the housing 100. The lid 200 is attached to the housing 100. The lid 200 includes a top cover 210 and a cap cover 220. The top cover 210 is formed of, for example, resin and has a tray-like shape and is detachably attached to a position where the lid 200 closes the opening of the housing 100. Specifically, screws 213 are screwed in screw receiving holes 13, which are provided in the housing 100, through screw receiving holes 214 provided at four corners of the top cover 210 and are fixed, whereby the top cover 210 is attached to the housing 100.

The top cover 210 includes a bottom surface 211 and sidewalls 212 on four surfaces in the periphery of the bottom surface 211. The sidewalls 212 are erected at edges of the bottom surface 211 to project upward and surrounds the bottom surface 211 in a square shape. The top cover 210 includes a plurality of ribs 26 erected from the bottom surface 211. The ribs 26 support a top surface 221 (explained below) of the cap cover 220 explained below and prevent a bend of the top surface 221.

The top cover 210 includes a ventilation port 216 in a position facing the fan 102 near substantially the center of the bottom surface 211. The ventilation port 216 includes a large number of ventilation holes 22. The ventilation holes 22 are holes that cause a first space section 107 and a second space section 226 explained below to communicate. That is, the ventilation port 216 causes the first space section 107 and the second space section 226 to communicate. In the first embodiment, the ventilation port 216 is a hole for feeding air in the second space section 226 to the first space section 107 according to the rotation of the fan 102.

The bottom surface 211 does not include, other than the ventilation port 216, a hole or a gap that causes the first space section 107 and the second space section 226 to communicate. That is, the top cover 210 separates the first space section 107 and the second space section 226 excluding the ventilation port 216. The separating means not causing (blocking) or substantially not causing (substantially blocking) a flow of air from the first space section 107 to the second space section 226 and a flow of air from the second space section 226 to the first space section 107.

The cap cover 220 is attached over the top cover 210. The cap cover 220 includes a flat top surface 221 and leg sections 222.

The top surface 221 is a surface facing the bottom surface 211 of the top cover 210 with a gap equivalent to the height of the ribs 26. A space sandwiched by the top surface 221 and the bottom surface 211 and surrounded by the sidewalls 212 is the second space section 226. The lid 200 includes the second space section 226. The leg sections 222 are portions provided at edges of the top surface 221 and fit in the inner sides of the sidewalls 212 of the top cover 210.

The leg sections 222 are interposed between partition walls 25 and the sidewalls 212 facing the partition walls 25 and have a planar shape. Since the leg sections 222 are in contact with slopes 231, portions 223 in contact with a top section 23 are hollowed in a concave shape.

The leg sections 222 are provided in positions where the leg sections 222 do not close the second ventilation holes 21 provided in the sidewalls 212 of the top cover 210. In other words, the leg sections 222 include cutouts 224 in positions facing the second ventilation holes 21.

The cap cover 220 includes two pairs of claw sections 225. The paired claw sections 225 are provided across the cutouts 224. Distal end portions of the claw sections 225 have a shape warped to the outer side and have elasticity. The distal ends of the claw sections 225 are caught in engagement holes 215 provided at inner side four corners of the sidewalls 212 in a process of fitting the cap cover 220 in the top cover 210. Consequently, the top cover 210 and the cap cover 220 are engaged. The lid 200 in which the cap cover 220 is attached to the top cover 210 is obtained. If the cap cover 220 is detached from the top cover 210, the claw sections 225 are bent inward to thereby be released from being caught and removed upward.

If the top cover 210 is attached to the housing 100, the cap cover 220 is removed and the top cover 210 is screwed by the screws 213. In a state where the top cover 210 is attached to the housing 100, the cap cover 220 is attached to the top cover 210. If the top cover 210 is detached from the housing 100, the cap cover 220 is removed and the screws 213 are removed.

Figure 3:
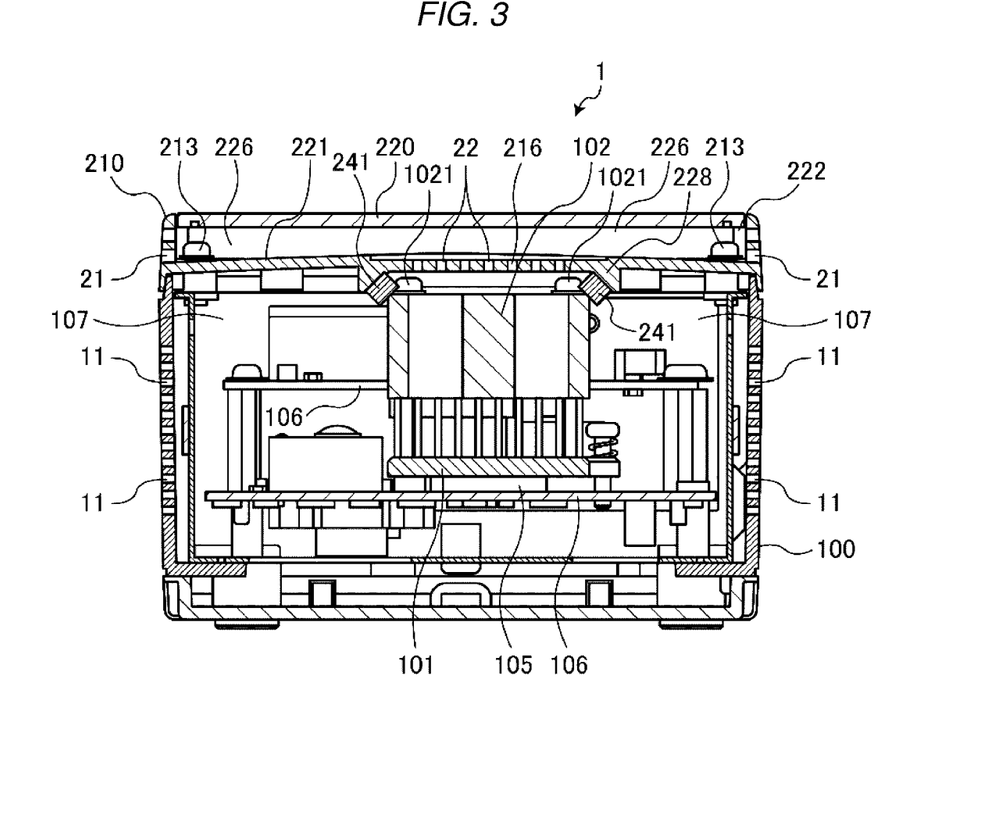
FIG. 3 is a longitudinal sectional view schematically illustrating the internal structure of the electronic device.

FIG. 3 is a longitudinal sectional view of the internal structure of the electronic device 1 taken along a schematically illustrated XZ plane. As illustrated in FIG. 3, the electric device 1 is divided into the first space section 107 and the second space section 226 by the top cover 210 (accurately, the bottom surface 211 of the top cover 210). That is, the top cover 210 (accurately, the bottom surface 211 of the top cover 210) separates the first space section 107 and the second space section 226 excluding the ventilation port 216. The first space section 107 is a space region in the housing 100 and is a region surrounded by the housing 100 and the top cover 210. The second space section 226 is a space region in the lid 200 and is a region surrounded by the top cover 210 and the cap cover 220.

The substrates 106, on which the electronic components including the CPU 105 are implemented, are fixed to the first space section 107 of the housing 100. In this embodiment, the substrates 106 are provided in upper and lower two stages. The CPU 105 is attached to the substrate 106 in the lower stage.

The heat sink 101 is attached on the CPU 105. The heat sink 101 is provided in the first space section 107 of the housing 100. The heat sink 101 is attached to the CPU 105 via a cushion sheet having high thermal conductivity called thermal sheet. The thermal sheet is a sheet that efficiently conducts heat generated in the CPU 105 to the heat sink 101.

The heat sink 101 is formed of metal such as aluminum and is configured by a base and a large number of thin substantially columnar pins extending upward from the base. The pins extend upward substantially in parallel at intervals and increase the surface area of the heat sink 101. Therefore, the heat sink 101 can radiate a large amount of heat to the outside air from the surface and can radiate heat generated in the CPU 105 and cool the CPU 105.

The fan 102 is attached above the heat sink 101. The fan 102 is provided in the first space section 107 of the housing 100. The fan 102 is screwed to the heat sink 101 by the four screws 1021 and fixed. The blades of the fan 102 rotates, whereby the fan 102 causes a flow of air downward from above (from the second space section 226 to the first space section 107).

The top cover 210 is provided substantially right above the fan 102. The ventilation port 216 (that is, the large number of ventilation holes 22) is located in a position right above the fan 102 and facing the fan 102.

The top cover 210 includes an enclosure section 228 extending downward in a protrusion shape. The enclosure section 228 is a square-shaped protrusion extending to the fan 102 side (that is, the first space section 107 side) to surround the ventilation port 216. Cushion rubbers 241 are stuck to the enclosure section 228. The cushion rubbers 242 are pressed against the corners 1022 of the fan 102 and closely fill the gap between the top cover 210 and the fan 102. The top cover 210 and the cushion rubbers 241 are explained below with reference to FIGS. 5 to 9. Air sucked from the ventilation port 216 by the rotation of the fan 102 is sent to the heat sink 101 by the fan 102. The air sucked from the ventilation port 216 does not leak to the first space section 107 through the gap between the fan 102 and the enclosure section 228 (that is, not through the heat sink 101).

The fan 102 rotates, whereby the outside air is sucked into the second space section 226 from the second ventilation holes 21. The second space section 226 is formed like a duct substantially sealed by the top cover 210 and the cap cover 220. Therefore, most of the air sucked into the second space section 226 is sent to the ventilation port 216 without leaking from the second space section 226.

Figure 4:
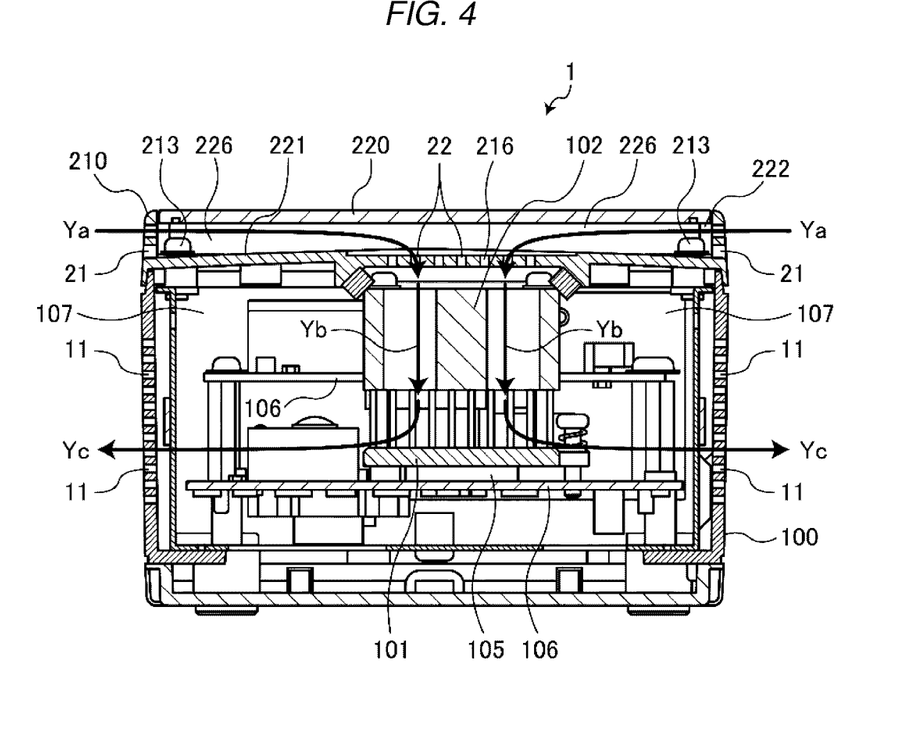
FIG. 4 is an explanatory diagram illustrating a flow of air in the sectional view of FIG. 3.

A flow of air in the electronic device 1 is explained with reference to FIG. 4. FIG. 4 is an explanatory diagram illustrating a flow of air in the electronic device 1 illustrated in FIG. 3. As illustrated in FIG. 4, if the fan 102 rotates, the outside air is sucked into the second space section 226 through the second ventilation holes 21 as indicated by an arrow Ya. The sucked air is sucked by the fan 102 through the duct-like second space section 226 and through the ventilation port 216 (specifically, the large number of ventilation holes 22). The air sucked by the fan 102 passes in the fan 102 as indicated by an arrow Yb and is sent to the heat sink 101. The air sent to the heat sink 101 passes among the erected plurality of pins and discharged to the outside from the first ventilation holes 11 and the first ventilation holes 12 through the first space section 107. Since heat is conducted from the heat sink 101 to the air passing through the heat sink 101, the air cools the heat sink 101. Since the heat sink 101 is a component that radiates heat generated in the CPU 105, if the heat sink 101 is cooled, the CPU 105 is also cooled. Note that, although not illustrated in FIG. 4, the air passed through the heat sink 101 is discharged to the outside from the first ventilation holes 12 as well.

Note that, in the first embodiment, the air sent to the heat sink 101 is discharged to the outside from the first ventilation holes 11 and the first ventilation holes 12. However, for example, only the first ventilation holes 11 may 11 may be provided and the first ventilation holes 12 may not be provided. In this case, the air is discharged from the first ventilation holes 11. However, in order to more efficiently cool the heat sink 101, it is desirable to provide a large number of ventilation holes in the housing 100 and discharge the air. Therefore, in the first embodiment, the first ventilation holes 11 and the first ventilation holes 12 are provided.

Figure 5:
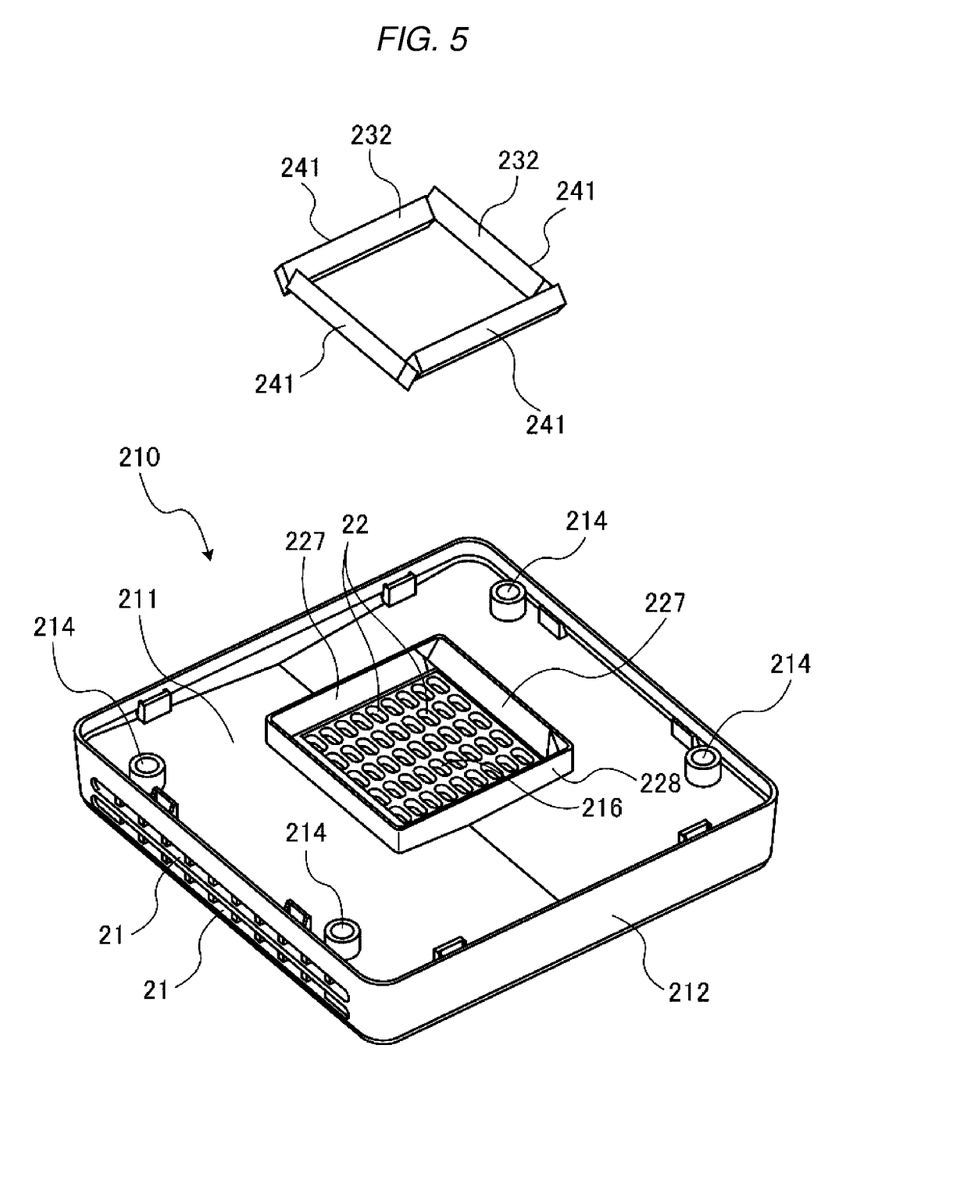
FIG. 5 is a perspective view illustrating the structure of a top cover and cushion rubbers.

The top cover 210 and the cushion rubbers 241 are explained blow. FIG. 5 is a perspective view illustrating the structure of the top cover 210 and the cushion rubbers 241. The enclosure section 228 is formed in a position near the center of the top cover 210 and facing the fan 102. The enclosure section 228 is a protrusion projecting toward the fan 102 side in a substantially square shape. The ventilation port 216 including the large number of ventilation holes 22 is formed on the inside of the enclosure section 228.

Inclined surfaces 227 are respectively formed in square-shaped sides (four sides) of the enclosure section 228. An angle of the inclined surfaces 227 is desirably approximately 45 degrees. The cushion rubbers 241 are stuck to the inclined surfaces 227. The cushion rubbers 241 are materials made of, for example, foaming polyurethane and having elasticity. The cushion rubbers 241 are formed in a substantially prism shape. The cushion rubbers 241 are respectively bonded or attached (hereinafter collectively referred to as "attached") to the included surfaces 227 in four places.

Figure 6:
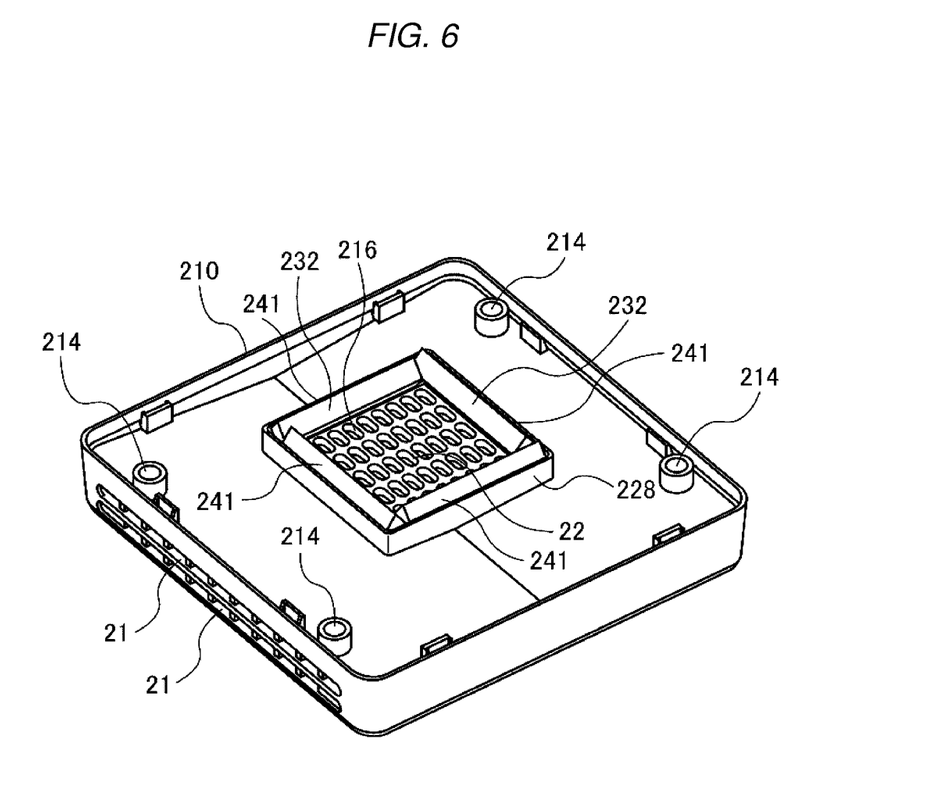
FIG. 6 is a perspective view illustrating the top cover attached with the cushion rubbers.
Figure 7:
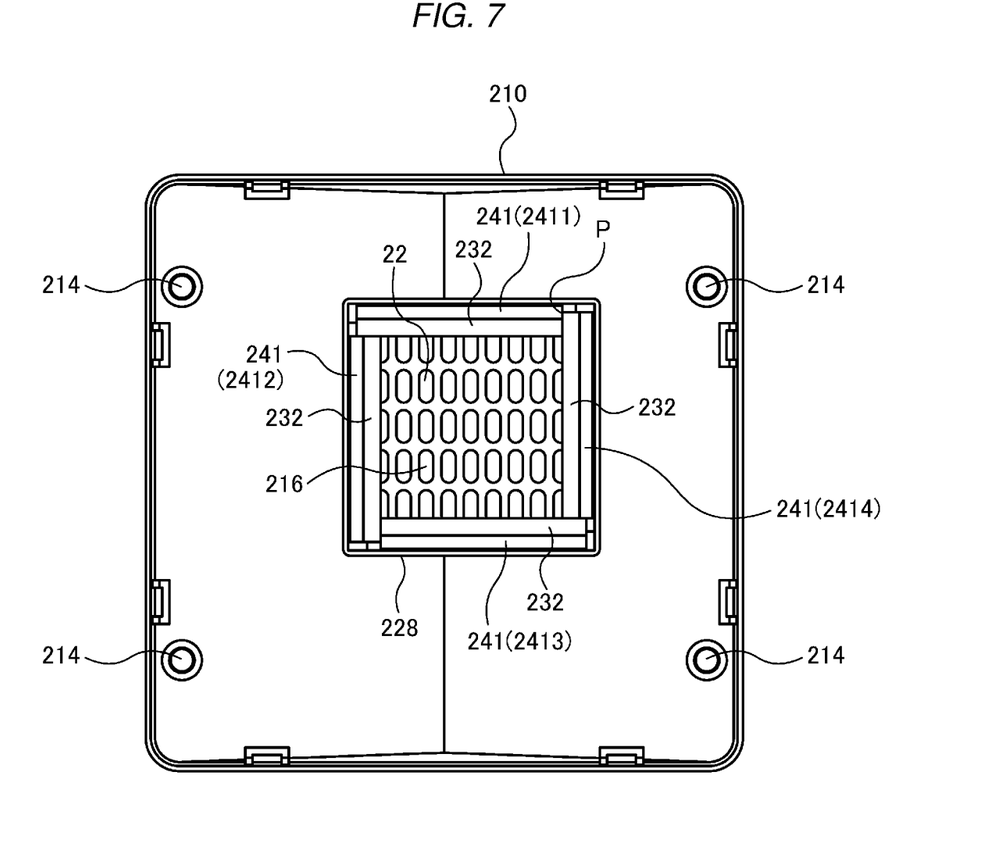
FIG. 7 is a plan view illustrating the top cover attached with the cushion rubbers.

FIG. 6 is a perspective view illustrating the top cover 210 attached with the cushion rubbers 241. FIG. 7 is a plan view illustrating the top cover 210 attached with the cushion rubbers 241. The respective cushion rubbers 241 attached to the inclined surfaces 227 include surfaces 232 (inclined surfaces). The surfaces 232 are located in positions facing the corners 1022 of the fan 102. If the top cover 210 is attached to the housing 100, the surfaces 232 come into contact with the corners 1022 in an oblique direction and are finally pressed against the corners 1022. An inclination angle of the surfaces 232 in contact with the corners 1022 and pressed against the corners 1022 is optimally approximately 45°.

Note that, as illustrated in FIG. 7, the cushion rubbers 241 include four cushion rubbers 241, that is, a cushion rubber 2411 to a cushion rubber 2414. A mark line P serving as a reference point for attaching a first cushion rubber 241 is marked in the enclosure section 228. First, the cushion rubber 2411 is attached to the inclined surface 227 along the mark line P. Thereafter, the cushion rubber 2412 is attached to the inclined surface 227 to bring an end portion of the cushion rubber 2412 into contact with the attached cushion rubber 2411. The cushion rubber 2413 and the cushion rubber 2414 are attached to the inclined surfaces 227 in the same manner. The cushion rubbers 241 are attached in the order of the cushion rubber 2411 to the cushion rubber 2414 in this way, whereby the cushion rubbers 241 are closely attached to one another.

Figure 8:
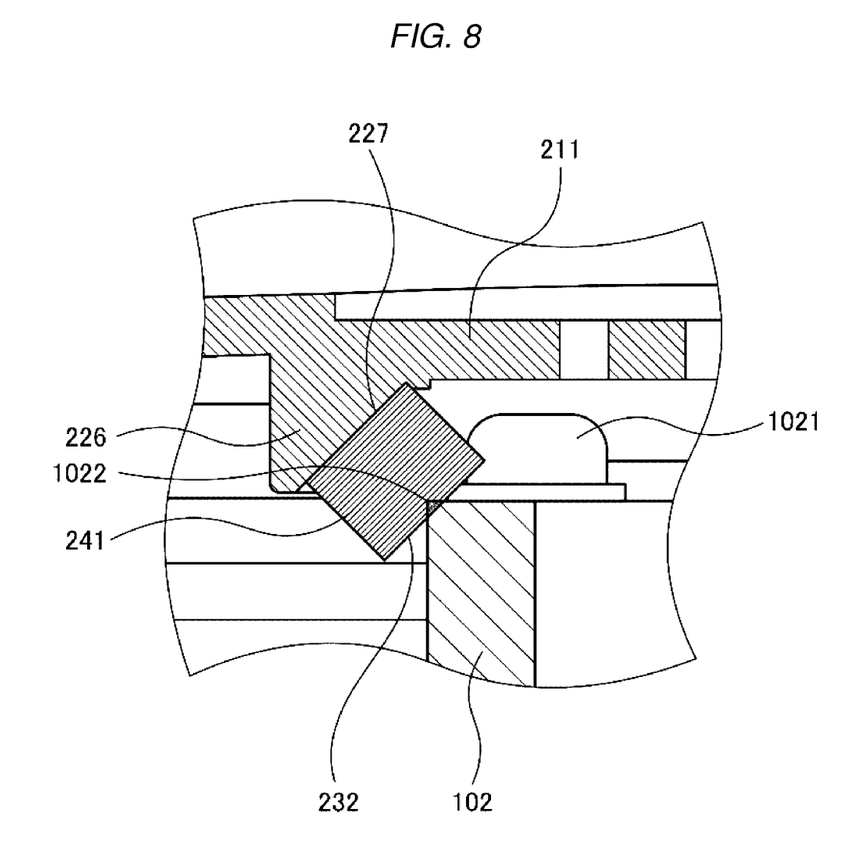
FIG. 8 is an explanatory diagram illustrating contact of the cushion rubber and a fan.
Figure 9:
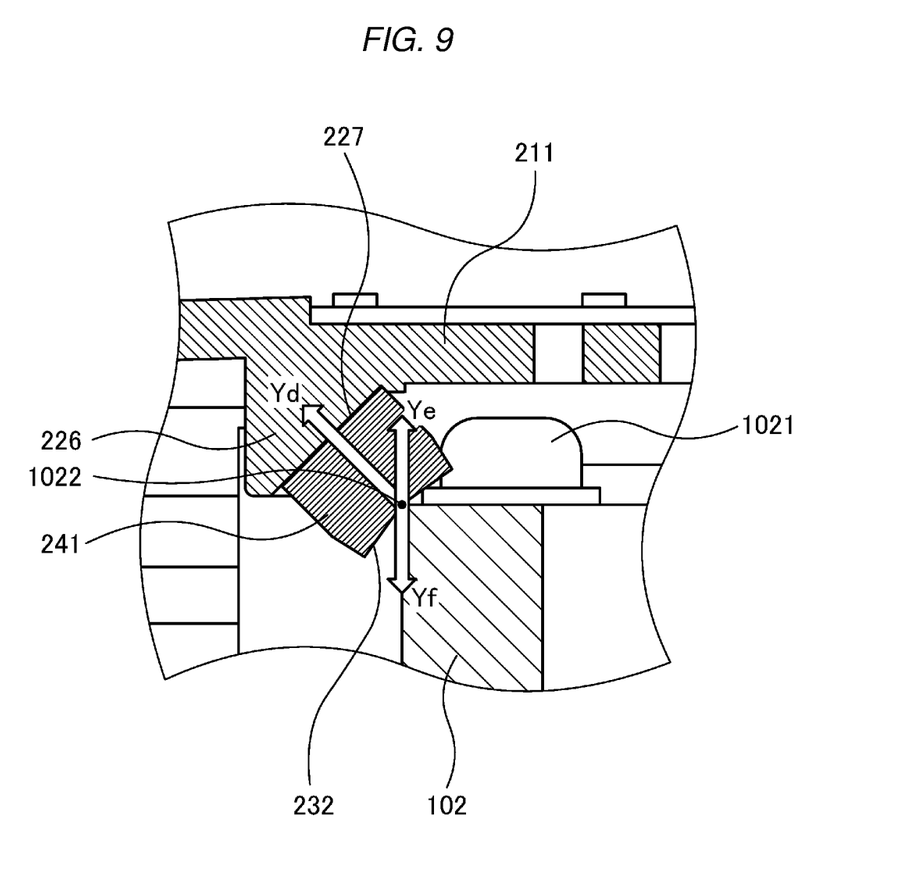
FIG. 9 is an explanatory diagram illustrating a component force in a state in which the cushion rubber is pressed against the fan.

FIG. 8 is an explanatory diagram illustrating the contact of the cushion rubber 241 and the corner 1022 of the fan 102. FIG. 9 is an explanatory diagram illustrating a component force in a state in which the cushion rubber 241 is pressed against the corner 1022 of the fan 102.

As explained above, the surface 232 of the cushion rubber 241 comes into contact with the corner 1022 at the angle of approximately 45° in the process in which the top cover 210 is attached to the housing 100 (a state illustrated in FIG. 8). Thereafter, if the top cover 210 is completely attached to the housing 100, as illustrated in FIG. 9, the cushion rubber 241 is pressed against the corner 1022 and deformed. In such a state, the cushion rubber 241 seals the gap between the top cover 210 and the fan 102. Therefore, it is possible to prevent air sucked from the ventilation port 216 by the rotation of the fan 102 from leaking from the gap between the top cover 210 and the fan 102 to the first space section 107. Therefore, it is possible to feed most of the air sucked from the ventilation port 216 by the rotation of the fan 102 into the heat sink 101. It is possible to efficiently cool the heat sink 101. If the heat sink 101 is efficiently cooled, the CPU 105 is also efficiently cooled.

Since the surface 232 of the cushion rubber 241 is in contact with the corner 1022 at the angel of approximately 45°, as illustrated in FIG. 9, the cushion rubber 241 receives stress in an arrow Yd direction (the angle of approximately 45° from the corner 1022. However, a component force in the up-down direction (the Z direction) of the stress decreases in an arrow Ye direction. Therefore, reaction force in an arrow Yf direction corresponding to the stress in the Ye direction is also force equivalent to the stress in the arrow Ye direction. That is, even if the cushion rubber 241 is pressed by the corner 1022 of the fan 102 and deformed, since the surface 232 is inclined and pressed in an oblique direction (the arrow Yd direction) from the corner 1022, downward reaction force is attenuated. Then, a load on the CPU 105 by the reaction force (a load applied to the CPU 105) is also reduced. Since the load applied to the CPU 105 is originally limited from the viewpoint of durability, it is possible to reduce the load (reaction force) on the CPU 105 by pressing the cushion rubber 241 against the corner 1022 at the angle in this way.

Second Embodiment

Figure 10:
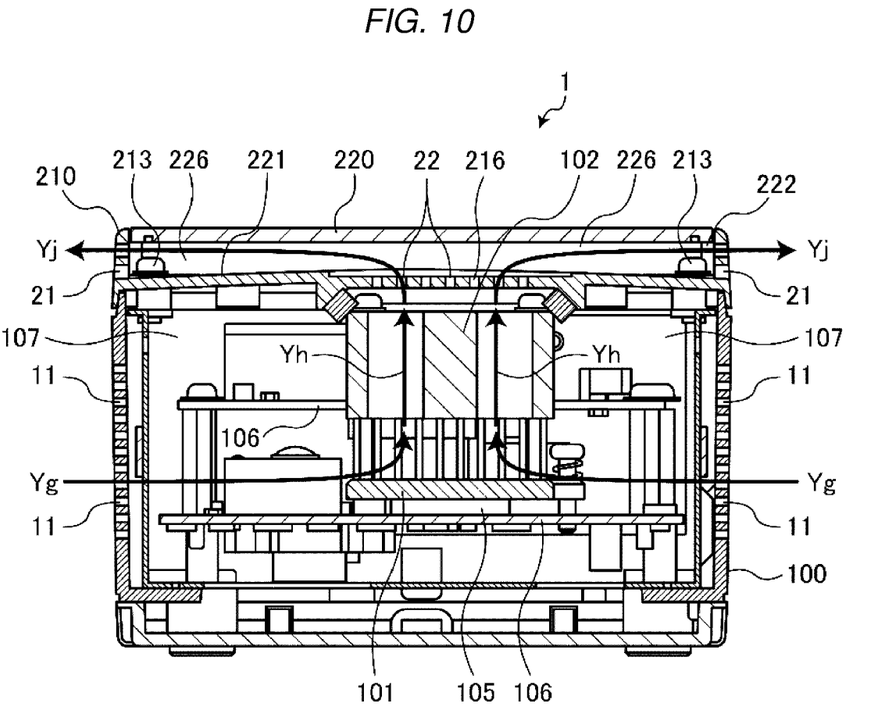
FIG. 10 is an explanatory diagram illustrating a flow of air in a second embodiment.

A second embodiment is explained below. In the second embodiment, a rotating direction of the fan 102 is opposite to the rotating direction in the first embodiment and an air flowing direction in the electronic device 1 is opposite to the air flowing direction in the first embodiment. The second embodiment is the same as the first embodiment except that the rotating direction of the fan 102 is opposite. Therefore, in the second embodiment, FIG. 4 is changed to FIG. 10. However, the other drawings can be used in the second embodiment as well. FIG. 10 is an explanatory diagram (a diagram facing FIG. 4) illustrating a flow of air in the second embodiment.

FIG. 10 is an explanatory diagram illustrating a flow of air in the electronic device 1 illustrated in FIG. 3. As illustrated in FIG. 10, if the fan 102 rotates, the outside air is sucked into the first space section 107 from the first ventilation holes 11 and the first ventilation holes 12 as indicated by an arrow Yg. The sucked air passes near the heat sink 101 according to the rotation of the fan 102 and is sucked by the fan 102 while taking heat radiated by the heat sink 101. Thereafter, the air passes through the fan 102 (an arrow Yh) and is carried to the second space section 226 as indicated by an arrow Yj through the ventilation port 216 (specifically, the large number of ventilation holes 22) and discharged to the outside from the second ventilation holes 21. Note that, in the second embodiment, the first ventilation holes 11 and the first ventilation holes 12 are intake holes and the second ventilation holes 21 are exhaust holes.

In the second embodiment explained above as well, the air passing through the heat sink 101 cools the heat sink 101 because heat is conducted from the heat sink 101. Since the cushion rubbers 241 seal the gap between the top cover 210 and the fan 102, it is possible to prevent air sucked into the first space section 107 by the rotation of the fan 102 from leaking to the second space section 226 not through the heat sink 101. Therefore, it is possible to feed the air, which is sucked into the first space section 107 by the rotation of the fan 102, into the heat sink 101 without leaking the air. It is possible to efficiently cool the heat sink 101. If the heat sink 101 is efficiently cooled, the CPU 105 is also efficiently cooled.

As explained above, the electronic device 1 according to the first embodiment and the second embodiment includes the housing 100 including the hollow first space section 107 with one surface thereof opened and including the first ventilation holes 11 and the first ventilation holes 12 that cause the outside and the first space section 107 to communicate, the lid 200 provided to close the opening of the housing 100 and including the hollow second space section 226 and including the second ventilation holes 21 that cause the outside and the second space section 226 to communicate, the heat sink 101 that is provided in the first space section 107 and radiates heat generated from the CPU 105 housed in the housing 100, and the fan 102 that is provided in the first space section 107 and cools the heat sink 101 with a flow of air caused by the fan 102 rotating. The lid 200 includes, in the position facing the fan 102, the ventilation port 216 that causes the first space section 107 and the second space section 226 to communicate and the lid 200 separates the first space section 107 and the second space section 226 excluding the ventilation port 216.

The electronic device 1 having the configuration explained above can efficiently cool the heat sink 101 with the air sucked from the outside by the fan 102. Therefore, it is possible to efficiently cool the electronic components.

Note that, in the second embodiment, the air is sucked into the housing 100 from the first ventilation holes 11 and the first ventilation holes 12. However, for example, only the first ventilation holes 11 may be provided and the first ventilation holes 12 may not be provided. In this case, the air is sucked from the first ventilation holes 11. However, in order to more efficiently cool the heat sink 101, it is desirable to provide a larger number of ventilation holes in the housing 100 and suck the air. Therefore, in the second embodiment, the first ventilation holes 11 and the first ventilation holes 12 are provided.

The first embodiment and the second embodiment are explained above. However, the embodiments are presented as examples and are not intended to limit the scope of the invention. These new embodiments can be implemented in other various forms. Various omissions, substitutions, changes, and combinations can be performed in a range not departing from the gist of the invention. The embodiments and modifications thereof are included in the scope and the gist of the invention and included in the inventions described in the claims and a scope of equivalents of the inventions.

For example, in the first and second embodiments, the heat sink 101 is attached to the CPU 105 and heat generated from the CPU 105 is radiated. However, not only this, but the heat sink 101 may be connected to another electronic component and may radiate heat generated from the electronic component.

What is claimed is:
1. An electronic device, comprising:
a housing including a hollow first space with one surface of the hollow first space opened and including a first ventilation hole that causes an outside of the electronic device and the hollow first space to communicate;
a lid provided to close the open one surface of the housing, including a hollow second space, and including a second ventilation hole that causes the outside of the electronic device and the hollow second space to communicate;
a heat sink provided in the hollow first space and configured to radiate heat generated from an electronic component housed in the housing; and a fan provided in the hollow first space and configured to cool the heat sink with a flow of air caused by rotation of the fan, wherein the lid further includes:
- in a position facing the fan, a ventilation port that causes the hollow first space and the hollow second space to communicate and is configured to separate the hollow first space and the hollow second space excluding the ventilation port,
- a top cover including the second ventilation hole and the ventilation port and configured to separate the hollow first space and the hollow second space, and
- a cap cover provided above the top cover to form the second space between the cap cover and the top cover.

2. The electronic device according to claim 1, wherein the first ventilation hole is an exhaust hole, the second ventilation hole is an intake hole, and, if the fan rotates, air sucked from the second ventilation hole is sent to the heat sink through the ventilation port and discharged to the outside of the electronic device from the first ventilation hole.

3. The electronic device according to claim 1, wherein the fan includes substantially square corners on the top cover side, and
cushion rubbers that are pressed against substantially the entire corners are provided around the ventilation port.

4. The electronic device according to claim 3, wherein the cushion rubbers include inclined surfaces, and the inclined surfaces are pressed against the corners from an oblique direction.

5. The electronic device according to claim 1, wherein the housing has a substantially rectangular parallelepiped shape.

6. The electronic device according to claim 1, wherein the lid and the open one surface of the housing have substantially a same shape.

7. The electronic device according to claim 1, wherein the second ventilation hole comprises a plurality of holes.

8. The electronic device according to claim 1, wherein the electronic component is a central processing unit.

9. A method of cooling an electronic device, comprising:
radiating heat generated from an electronic component housed in a housing via a heat sink in a hollow first space, the housing including the hollow first space with one surface of the hollow first space opened and including a first ventilation hole that causes an outside of the electronic device and the hollow first space to communicate, the electronic device also comprising a lid provided to close the open one surface of the housing, including a hollow second space, and including a second ventilation hole that causes the outside of the electronic device and the hollow second space to communicate;
cooling the heat sink with a flow of air caused by rotation of a fan provided in the hollow first space; and
causing the hollow first space and the hollow second space to communicate via a ventilation port.

10. The method according to claim 9, further comprising:
rotating the fan to cause air sucked from the second ventilation hole to be sent to the heat sink through the ventilation port and discharged to the outside of the electronic device from the first ventilation hole, wherein the first ventilation hole is an exhaust hole and the second ventilation hole is an intake hole.

11. An image processing device, comprising:
a component configured to generate an image based on information;
a housing including a hollow first space with one surface of the hollow first space opened and including a first ventilation hole that causes an outside of the image processing device and the hollow first space to communicate;
a lid provided to close the open one surface of the housing, including a hollow second space, and including a second ventilation hole that causes the outside of the image processing device and the hollow second space to communicate;
a heat sink provided in the hollow first space and configured to radiate heat generated from an electronic component housed in the housing; and
a fan provided in the hollow first space and configured to cool the heat sink with a flow of air caused by rotation of the fan, wherein
the lid further includes, in a position facing the fan, a ventilation port that causes the hollow first space and the hollow second space to communicate and is configured to separate the hollow first space and the hollow second space excluding the ventilation port.

12. The image processing device according to claim 11, wherein the lid further includes:
a top cover including the second ventilation hole and the ventilation port and configured to separate the hollow first space and the hollow second space; and
a cap cover provided above the top cover to form the second space between the cap cover and the top cover.

13. The image processing device according to claim 12, wherein
the fan includes substantially square corners on the top cover side, and
cushion rubbers that are pressed against substantially the entire corners are provided around the ventilation port.

14. The image processing device according to claim 13, wherein the cushion rubbers include inclined surfaces, and the inclined surfaces are pressed against the corners from an oblique direction.

15. The image processing device according to claim 11, wherein
the first ventilation hole is an exhaust hole, the second ventilation hole is an intake hole, and, if the fan rotates, air sucked from the second ventilation hole is sent to the heat sink through the ventilation port and discharged to the outside of the image processing device from the first ventilation hole.

16. The image processing device according to claim 11, wherein the housing has a substantially rectangular parallelepiped shape.

17. The image processing device according to claim 11, wherein the lid and the open one surface of the housing have substantially a same shape.

18. The image processing device according to claim 11, wherein the second ventilation hole comprises a plurality of holes.

19. The image processing device according to claim 11, wherein the electronic component is a central processing unit.

* * * * *